United States Patent
Danyuk et al.

(10) Patent No.: US 10,742,184 B2
(45) Date of Patent: *Aug. 11, 2020

(54) PLURAL FEEDBACK LOOPS INSTRUMENTATION FOLDED CASCODE AMPLIFIER

(71) Applicant: HARMAN INTERNATIONAL INDUSTRIES, INCORPORATED, Stamford, CT (US)

(72) Inventors: Dimitri Danyuk, Stamford, CT (US); Todd A. Eichenbaum, Oxford, CT (US)

(73) Assignee: Harman International Industries, Incorporated, Stamford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/129,972

(22) Filed: Sep. 13, 2018

(65) Prior Publication Data

US 2019/0036501 A1    Jan. 31, 2019

Related U.S. Application Data

(63) Continuation of application No. 15/664,777, filed on Jul. 31, 2017, now Pat. No. 10,084,421.

(51) Int. Cl.
*H03F 3/45* (2006.01)
*H03G 3/00* (2006.01)
(Continued)

(52) U.S. Cl.
CPC ........... *H03G 3/007* (2013.01); *H03F 1/3211* (2013.01); *H03F 3/183* (2013.01);
(Continued)

(58) Field of Classification Search
CPC ........................................................ H03F 3/45
(Continued)

(56) References Cited

U.S. PATENT DOCUMENTS 3,473,134 A    10/1969  Hughes
4,172,238 A *  10/1979  Kusakabe ................. H03F 3/45
                                                           330/252

(Continued)

FOREIGN PATENT DOCUMENTS

GB    2268014 A    12/1993

OTHER PUBLICATIONS

Banu, M. et al., "Fully Differential Operational Amplifiers with Accurate Output Balancing", IEEE Journal of Solid-State Circuits, Dec. 1988, pp. 1410-1414, vol. 23, No. 6.

(Continued)

*Primary Examiner* — Henry Choe
(74) *Attorney, Agent, or Firm* — Brooks Kushman, P.C.

(57) ABSTRACT

An instrumentation amplifier configured for providing high common mode rejection is described and includes an input differential stage configured to receive a differential input voltage and a folded cascode amplifying stage configured to receive output current mode signals provided from the input differential pair. A plurality of feedback networks is provided to improve the input stage. The amplifier may operate to provide an enhanced common mode rejection ratio of a single gain block in the instrumentation amplifier. In some examples, the circuitry may have a differential folded cascode amplifying stage which permits high precision and low distortion of amplified signals without degrading the common mode rejection ratio.

17 Claims, 8 Drawing Sheets

(51) Int. Cl.
 *H03F 3/183* (2006.01)
 *H03G 1/00* (2006.01)
 *H03F 1/32* (2006.01)

(52) U.S. Cl.
 CPC ..... *H03F 3/45304* (2013.01); *H03F 3/45488* (2013.01); *H03G 1/0023* (2013.01); *H03G 1/0082* (2013.01); *H03F 2200/03* (2013.01); *H03F 2200/261* (2013.01); *H03F 2203/45116* (2013.01); *H03F 2203/45134* (2013.01); *H03F 2203/45431* (2013.01); *H03F 2203/45432* (2013.01); *H03F 2203/45528* (2013.01)

(58) Field of Classification Search
 USPC .......................................... 330/254, 260, 261
 See application file for complete search history.

(56) References Cited

U.S. PATENT DOCUMENTS

| | | | |
|---|---|---|---|
| 4,578,647 A * | 3/1986 | Sasamura | H03F 3/45381 330/253 |
| 4,742,308 A | 5/1988 | Banu | |
| 5,376,899 A | 12/1994 | Pass | |
| 5,596,299 A * | 1/1997 | Persico | H03G 7/001 330/260 |
| 6,150,885 A | 11/2000 | Ashby et al. | |
| 6,316,970 B1 | 11/2001 | Hebert | |
| 6,356,152 B1 | 3/2002 | Jezdic et al. | |
| 6,628,168 B2 | 9/2003 | Martin et al. | |
| 6,703,898 B2 * | 3/2004 | Renous | H03F 1/086 330/253 |
| 7,088,179 B2 * | 8/2006 | Gilbert | H03F 1/26 330/254 |
| 7,368,983 B2 * | 5/2008 | Nishimori | H03F 3/45183 330/253 |
| 7,411,451 B2 * | 8/2008 | Alenin | H03F 3/45291 330/252 |
| 8,130,035 B2 * | 3/2012 | Weigandt | H03F 1/26 330/254 |
| 8,258,867 B2 * | 9/2012 | Zhang | H03F 3/195 330/252 |
| 2014/0077878 A1 | 3/2014 | Hsieh | |

OTHER PUBLICATIONS

Demrow, R., "Evolution from Operational Amplifier to Data Amplifier", IEEE Journal of Solid-State, Dec. 1, 1988, 39 pgs.

Dool, B. J. et al., "Indirect Current Feedback Instrumentation Amplifier with a Common-Mode Input Range that Includes the Negative Rail", IEEE Journal of Solid-State Circuits, Jul. 1993, pp. 743-749, vol. 28, No. 7.

Floru, F., "An Improved Microphone Preamplifier Integrated Circuit", Silicon for Audio—AES 16th UK Conference, 2001, pp. 103-116.

* cited by examiner

PLURAL FEEDBACK LOOPS INSTRUMENTATION FOLDED CASCODE AMPLIFIER

CROSS-REFERENCE TO RELATED APPLICATIONS

This application is a continuation of U.S. application Ser. No. 15/664,777 filed Jul. 31, 2017, now U.S. Pat. No. 10,084,421 issued Sep. 25, 2018, the disclosure of which is hereby incorporated in its entirety by reference herein.

TECHNICAL FIELD

The present disclosure generally relates to audio circuits and to balanced instrumentation folded cascode amplifiers.

BACKGROUND

FIG. 1 shows a prior art instrumentation amplifier 100 with differential input 101 and differential output 102. The instrumentation amplifier 100 includes differential input stage 103, with a negative signal receiving transistor 104 and a positive signal receiving transistor 105 forming an input pair. The base of transistor 104 receives the inverting input. The base of transistor 105 receives the noninverting input. Two amplifiers 106, 107 are respectively connected to the outputs of the transistors 104, 105. A differential input signal (−IN and +IN) is applied to the bases of transistors 104, 105 of the input differential stage 103. The outputs (−OUT and +OUT) of the two amplifiers 104, 105 are connected to the emitters of transistors 104, 105 of the input differential stage 103 through resistors 108, 109, 110.

FIG. 2 shows another prior art instrumentation amplifier 200 with differential input (INPUT1 and INPUT2) and differential output (OUTPUT1 and OUTPUT2). The base of transistor 204 receives the first input through resistor 208. The base of transistor 205 receives the second input through resistor 209. Two amplifiers 206, 207 are respectively connected to the outputs of the transistors 204, 205. The outputs of the two amplifiers 206, 207 are connected to the bases of transistors 204, 205 of the input differential input through resistors 210, 211. A third resistor 212 connects the emitters of the transistors 204, 205.

The instrumentation amplifiers 100, 200 have the drawback of large input capacitance. The Miller effect accounts for the increase in the input capacitance of the input devices due to amplification of the capacitance between the base and collector terminals. The junction capacitance depends on the applied voltage. Variation in the input capacitance at the input signal introduces additional distortion. Each transistor 104, 105 and 204, 205 of the amplifiers 100, 200 can be replaced with folded cascode circuit, see, e.g., U.S. Pat. No. 3,473,134. A folded cascode circuit may have a lower input capacitance, a higher gain, and an absence of a DC voltage difference between input and output terminals and may be easier to stabilize. Examples of modified topologies of a folded cascode circuit 300, 400 are shown in FIGS. 3 and 4.

An instrumentation amplifier circuit, having an input stage and an output stage, is balanced and preferably exhibit zero common mode component in its output signal. Instrumentation amplifier with differential output may operate with the floating load or with the load that has connection to ground. If the load that has connection to ground does not comprise two identical halves, then the output stages supply unequal currents, generate unequal distortion and produce a common mode component. The feedback networks in circuits 100, 200, 300, 400 shown in FIGS. 1-4 have no reference to the ground and do not sense common mode signal.

BACKGROUND

An instrumentation amplifier configured for providing high common mode rejection and low distortion is described. The instrumentation amplifier can include an input differential transistor pair including a first input transistor and a second input transistor and configured to receive a differential input voltage at a first feedback input and a second feedback input, and to output current mode signals. The instrumentation amplifier can include a folded cascode amplifying stage configured to receive output current mode signals provided from said input differential transistor pair, the folded cascode amplifying stage including first output terminal and a second output terminal. The instrumentation amplifier can include a plurality of feedback paths or networks, e.g., a first external gain setting circuitry comprising a first resistor feedback network and a second external gain setting circuitry comprising a second resistor feedback network.

In an example, the first resistor feedback network may include a first resistor, a second resistor and a third resistor. The first resistor is connected between the first feedback input and the second feedback input of said input differential transistor pair. The second resistor is connected between the first output terminal of the folded cascode stage and the second feedback input of said input differential transistor pair. The third resistor is connected between the second output terminal of the folded cascode amplifying stage and the first feedback input of said input differential transistor pair.

In an example, the second resistor feedback network includes a fourth resistor, a fifth resistor, a sixth resistor, and a seventh resistor. The fourth resistor is connected between a first signal input and a gate terminal of the first input transistor of said input differential transistor pair. The fifth resistor is connected between the first output terminal of the folded cascode amplifying stage and a gate terminal of the first input transistor of said input differential transistor pair. The sixth resistor is connected between a second input and a gate terminal of the second input transistor of said input differential transistor pair. The seventh resistor being connected between second output terminal of a folded cascode stage and the gate terminal of the second input transistor of said input differential pair.

In an example, the instrumentation amplifier may further comprise a first output buffer and a second output buffer, the first output buffer and the second output buffer being configured to receive a differential output signal from the folded cascode amplifying stage and provide an output voltage to the first external gain setting circuitry and the second external gain setting circuitry.

In an example, the instrumentation amplifier may further comprise a current buffer stage including a pair of transistors, each of the pair of transistors being configured as a current source to a corresponding transistor of the folded cascode amplifying stage, the current buffer stage being configured to provide a portion of a sum of the output voltage to input terminals of a folded cascode stage.

In an example, a dependent current source is connected to the current buffer stage. The dependent current source is configured to provide cancellation current to input terminals of folded cascode stage.

In an example, the instrumentation amplifier further comprises a first output buffer and a second output buffer, the first and second output buffers being configured to receive a differential signal from the folded cascode amplifying stage.

In an example, a third external gain setting circuitry is proved and comprises a third resistor feedback network. The third resistor feedback network includes an eighth resistor connected between an output terminal of the first output buffer and the second feedback input of said input differential transistor pair, and a ninth resistor connected between an output terminal of the second output buffer and the first feedback input of said input differential transistor pair.

In an example, a fourth external gain setting circuitry is provided and includes a tenth resistor connected between the output terminal of the first output buffer and the gate terminal of the first input transistor of said input differential transistor pair, and an eleventh resistor connected between the output terminal of a second output buffer and the gate terminal of the second input transistor of said input differential transistor pair.

An instrumentation amplifier is described and may, comprise an input differential stage configured to receive a differential input voltage at a first and a second input and to output current mode signals, the input differential stage including a first input transistor and a second input transistor; a folded cascode amplifying stage configured to receive output current mode signals from the input differential stage; and a plurality of feedback networks operating as gain setting circuitry, wherein a first resistor feedback network of the plurality of feedback networks providing feedback to the first input transistor and the second input transistor, wherein a second resistor feedback network of the plurality of feedback networks providing feedback to inputs of the first input transistor and the second input transistor.

In an example, the first resistor feedback network includes a first resistor connected between a first feedback input and a second feedback input of the first input transistor and the second input transistor; a second resistor connected between a first output terminal of the folded cascode stage and a second feedback input of the input differential stage; and a third resistor connected between a second output terminal of the folded cascode amplifying stage and a first feedback input of the input differential stage.

In an example, the second resistor feedback network includes a first resistor being connected between a first signal input and a gate terminal of the first input transistor of the input differential stage; a second resistor being connected between a first output terminal of the folded cascode amplifying stage and a gate terminal of the first input transistor of the input differential stage; a third resistor being connected between a second input and a gate terminal of the second input transistor of the input differential stage; and a fourth resistor being connected between a second output terminal of the folded cascode stage and the gate terminal of the second input transistor of the input differential stage.

In an example, the instrumentation amplifier further comprises an output buffer configured to receive a differential output signal from the folded cascode amplifying stage and provide an output voltage to the first resistor feedback network and the second resistor feedback network.

In an example, the instrumentation amplifier further comprises a current buffer stage including a pair of transistors, each of the pair of transistors being configured as a current source to a corresponding transistor of the folded cascode amplifying stage, the current buffer stage being configured to provide a portion of a sum of output signals from the amplifier to input terminals of a folded cascode amplifying stage; and a dependent current source connected to the current buffer stage, the dependent current source being configured to provide cancellation current to input terminals of folded cascode amplifying stage.

In an example, the instrumentation amplifier further comprises a first output buffer and a second output buffer, the first and second output buffers being configured to receive a differential signal from the folded cascode amplifying stage; and wherein the plurality of feedback networks includes a third resistor feedback network.

In an example, the third resistor feedback network includes a first resistor connected between an output terminal of the first output buffer and a second input of the input differential stage; and a second resistor connected between an output terminal of the second output buffer and the first input of the input differential stage.

In an example, the plurality of feedback networks includes a fourth resistor feedback network including a third resistor connected between the output terminal of the first output buffer and a gate terminal of the first input transistor of the input differential stage; and a fourth resistor connected between the output terminal of the second output buffer and a gate terminal of the second input transistor of the input differential stage.

In an example, the instrumentation amplifier further comprises a current buffer stage including a pair of transistors, each of the pair of transistors being configured as a current source to a corresponding transistor of the folded cascode amplifying stage, the current buffer stage being configured to provide a portion of the sum of the output signals to input terminals of a folded cascode stage; and a dependent current source connected to the current buffer stage, the dependent current source being configured to provide cancellation current to input terminals of folded cascode stage.

Other variations and combinations of the embodiments in the summary section are with on the scope of the present disclosure.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Instrumentation amplifier circuitry is described herein and may be used for processing audio signals, e.g., in audio amplifiers, signal processors and the like. The circuitry may include a plurality of feedback loops and a differential folded cascode input stage. The circuitry may operate to provide an enhanced common mode rejection ratio of a single gain block in the instrumentation amplifier. In some examples, the circuitry may have a differential folded cascode amplifying stage which permits high precision and low distortion of amplified signals without degrading the common mode rejection ratio. The above and other advantages of the present disclosure are carried out in one form by a differential folded cascode amplifier circuit, which may include a dependent current source and current followers.

Figure 1:
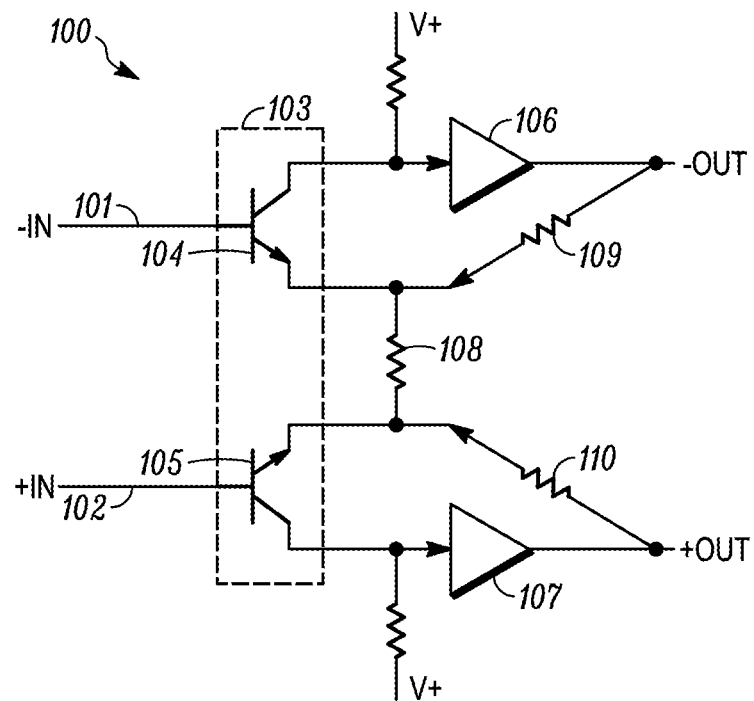
FIG. 1 illustrates a prior art circuit.
Figure 2:
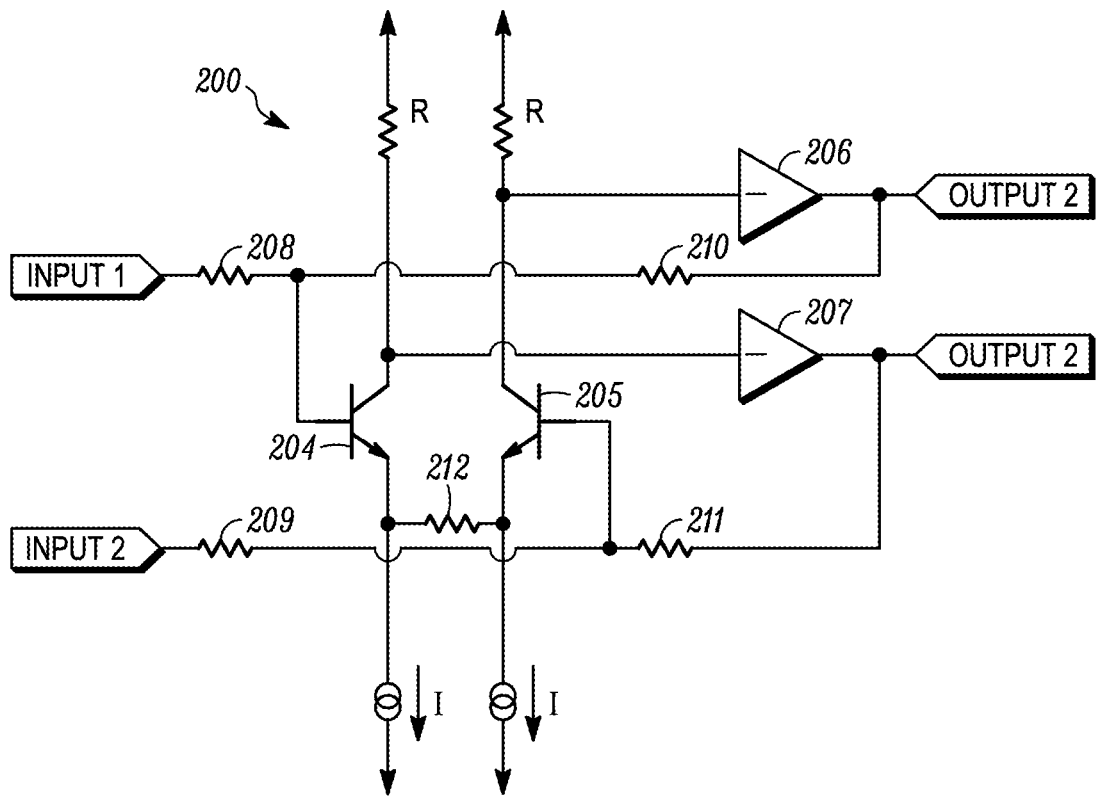
FIG. 2 illustrates a prior art circuit.
Figure 3:
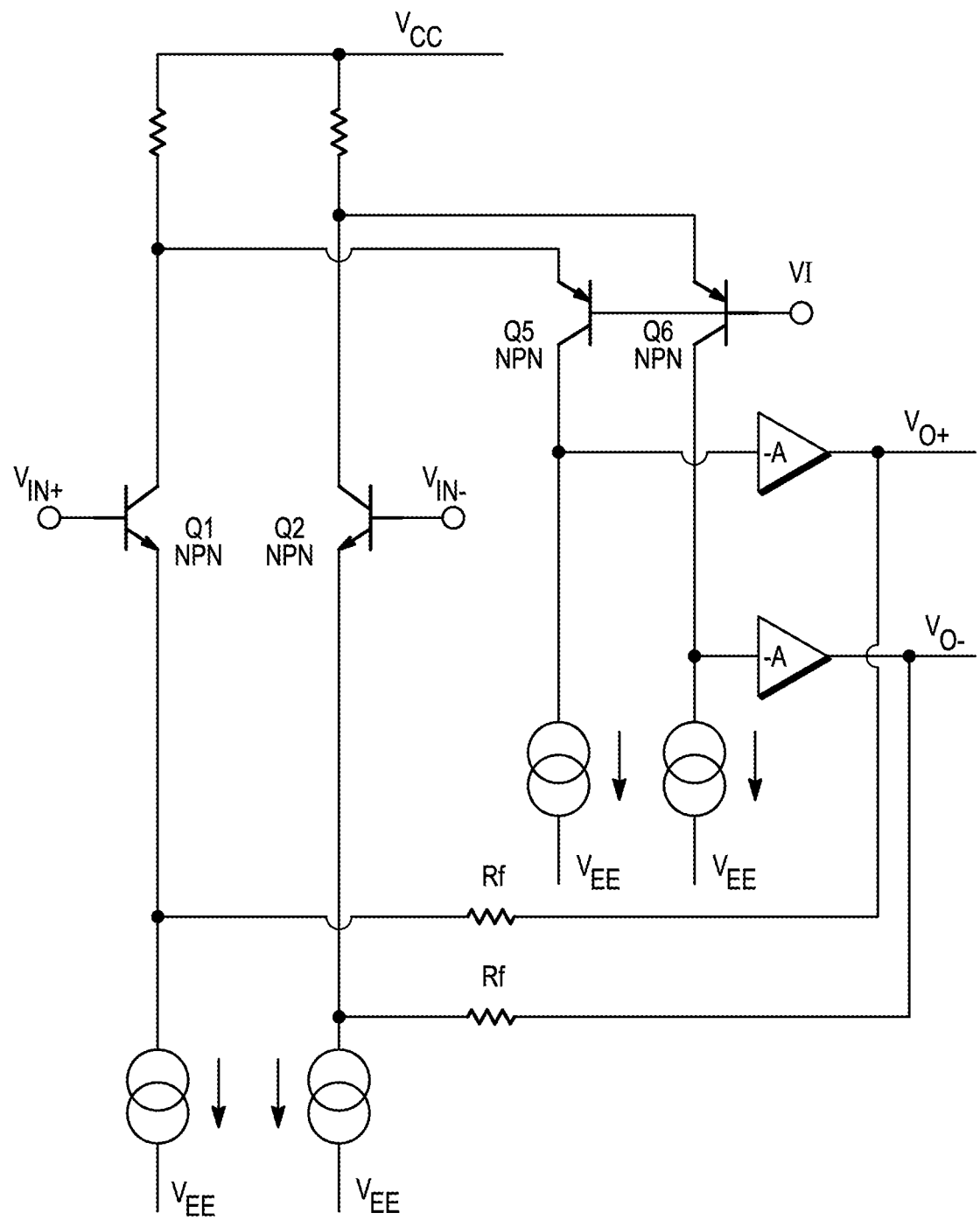
FIG. 3 illustrates a prior art circuit.
Figure 4:
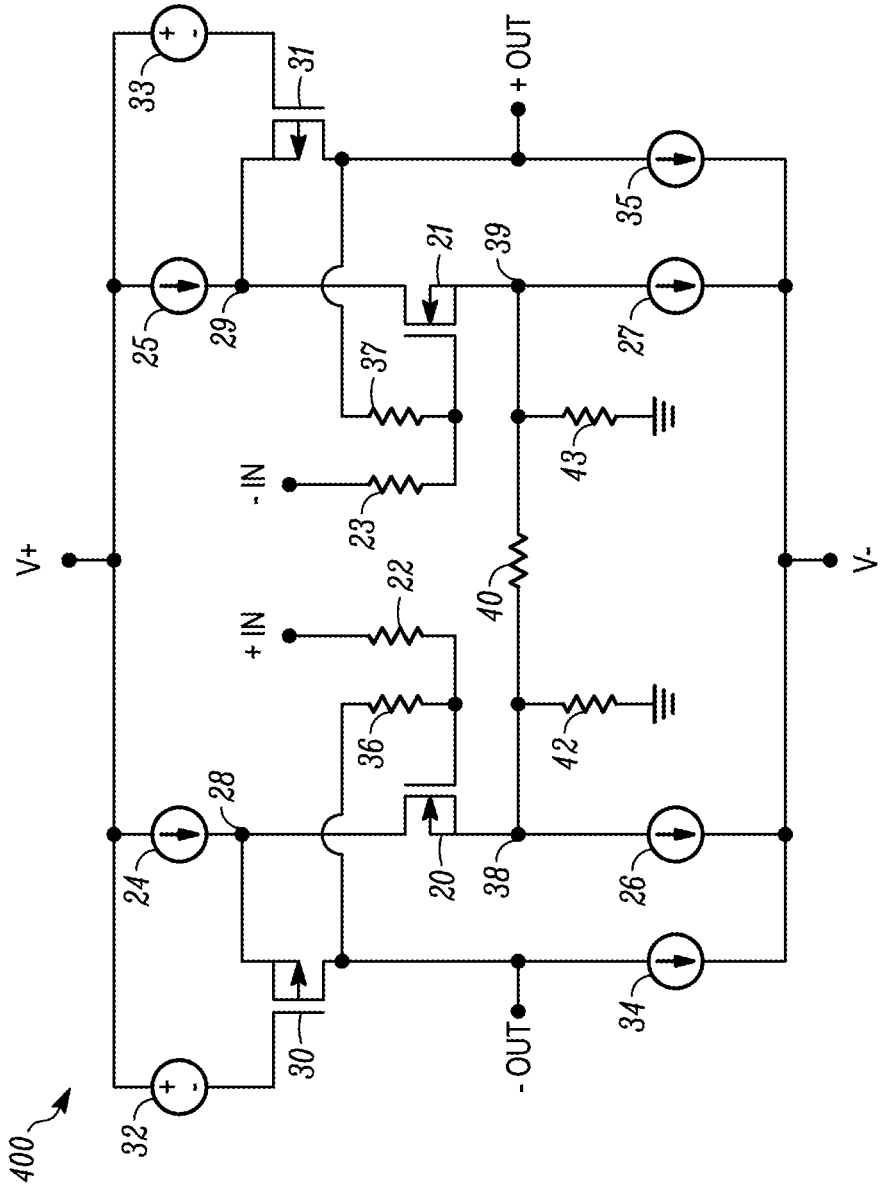
FIG. 4 illustrates a prior art circuit.
Figure 5:
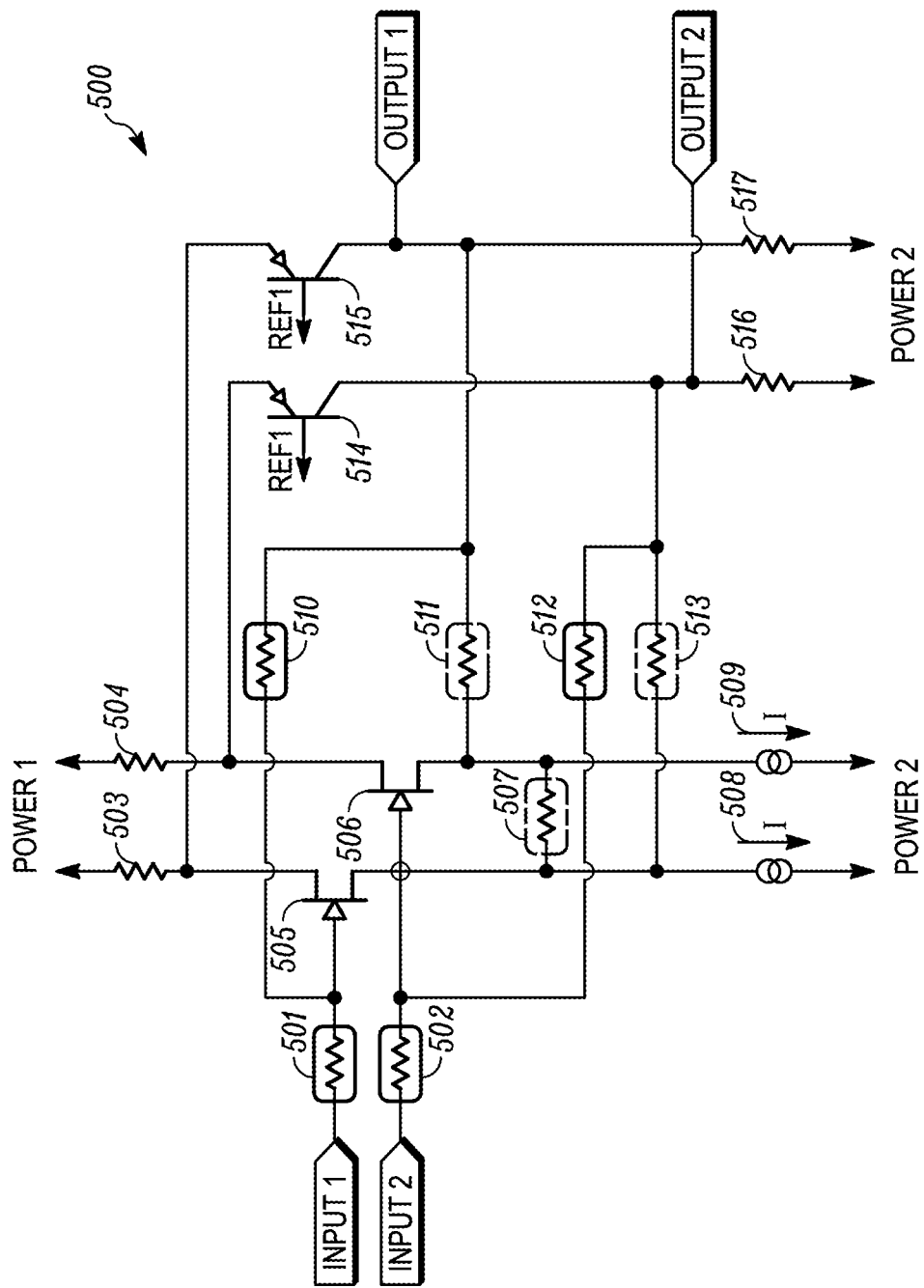
FIG. 5 illustrates a plural feedback loops instrumentation folded cascode amplifier, according to an embodiment.

FIG. 5 illustrates an example embodiment of an instrumentation amplifier circuit 500 with a plurality of feedback loops, e.g., to and from a folded cascode amplifying stage connected to a differential input stage. The differential input stage includes a first transistor 505 and a second transistor 506. The first and second transistors 505, 506 can form an input differential transistor pair. In an example, the transistors 505, 506 are field effect transistors. In an example, the transistors 505, 506 are jfets. The drain of each transistor 505, 506 is connected to a resistor 503, 504, respectively. The resistor 503 is connected to the drain of first transistor 505 and a first power source, e.g., a fixed voltage within an audio processing system. The resistor 504 is connected to the drain of second transistor 506 and the power source. The resistors 503, 504 act as loads to transistors 505, 506. The gate of transistor 505 is connected to the first input through a resistor 501. The gate of transistor 506 is connected to the second input through a resistor 502. The source of each transistor 505, 506 of the input stage is connected to a constant current source(s) 508, 509, respectively. In an example, the source of the transistor 505 is connected to the constant current source 508. In an example, the source of the transistor 506 is connected to the constant current source 509. The current sources 508, 509 set the current through the input stage, e.g, through the transistors 505, 506. The resistor 507, which can be part of a feedback network, acts to alter the conductance of the input stage, e.g., at the transistors 505, 506.

A folded cascode amplifying stage is connected to the differential input stage and may include a first amplifying transistor 514 and a second amplifying transistor 515. The drain of the first input transistor 505 is connected to an emitter of the second amplifying transistor 515. The drain of the second input transistor 506 is connected to an emitter of the first amplifying transistor 514. The bases of the first amplifying transistor 514 and the second amplifying transistor 515 are connected to a reference terminal, which provides a reference signal to control operation of the transistors. The collectors of both the first amplifying transistor 514 and the second amplifying transistor 515 are respectively connected through resistors 516, 517 to a second power source, e.g., a fixed voltage within an audio processing system. The resistors 516, 517 act as loads to the amplifying stage. The resistors 503, 504 act as current setting devices that set the current to the amplifying stage. The differential outputs of the circuit 500 from the collectors of the first amplifying transistor 514 and the second amplifying transistor 515.

The output signal from the folded cascode amplifying stage is fed back to differential input stage, e.g., through a resistor network. A signal from collector of the folded cascode transistor 515 and the output stage 520 is fed back to the source of second input transistor 506 through a resistor 511 and to the gate of first input transistor 505 through a resistor 510. The signal from the output stage 520 is fed back to the source of transistor 506 through a resistor 524 and to the gate of transistor 505 through resistor 526. The output signal from the cascode device 514 is fed back to the source of transistor 505 through a resistor 513 and to the gate of transistor 506 through resistor 512 and the signal from the output stage 523 is fed back to the source of transistor 505 through a resistor 525 and to the gate of transistor 506 through resistor 527. The sources of the transistors 505, 506 are connected through resistor 507.

The resistors 507, 511 and 513 can form a first feedback network to the differential input stage or a first external gain setting circuit. The resistors 501, 502, 510 and 512 can form a second external gain setting circuit. The resistors 510 and 512 can form a second feedback network to the differential input stage.

Figure 6:
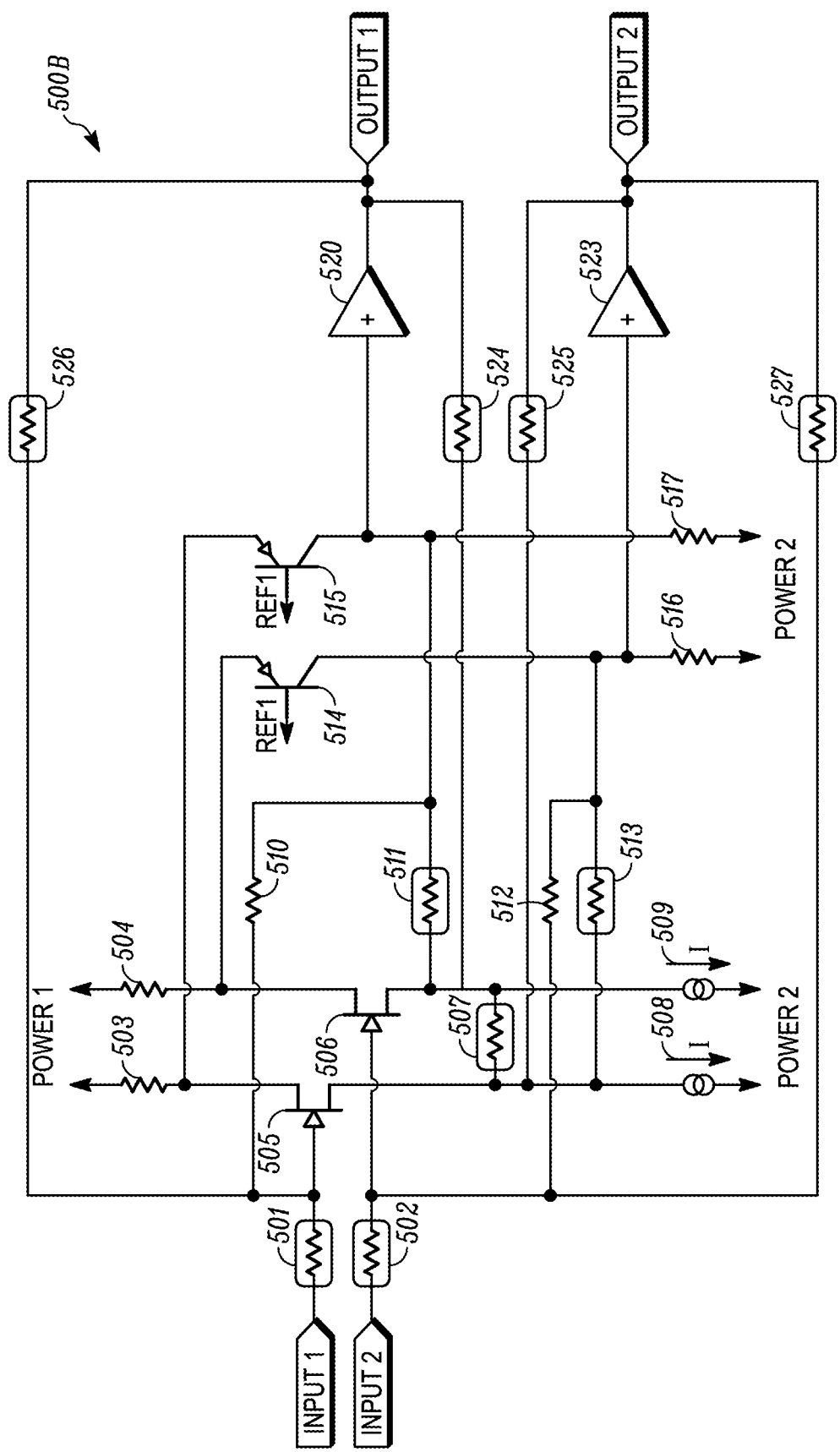
FIG. 6 illustrates a plural feedback loops instrumentation folded cascode amplifier, according to an embodiment.

FIG. 6 illustrates an example embodiment of an instrumentation amplifier circuit 500A with a plurality of feedback loops. Like elements to the preceding embodiments use the same reference numbers. The instrumentation amplifier circuit 500A is similar to the circuit 500 (FIG. 5) with additional feedback loops and output buffers. The instrumentation amplifier circuit 500A includes a third feedback network and a fourth feedback network from the output to the differential input stage. A signal from collector of the folded cascode transistor 515 is input into an output buffer 520 of the output stage. The output buffer 520 can be a single input opamp to protect the circuit 500A from and load changes or signals at the output (OUTPUT 1). The signal from collector of the second folded cascode transistor 515 is fed back to the source of second input transistor 506 through the resistor 511. The output signal from the output stage 520 is fed back to the source of second input transistor 506 through a resistor 524. The signal from collector of the first folded cascode transistor 514 is fed back to the source of first input transistor 505 through the resistor 513. The output signal from the output stage 523 is fed back to the source of the first input transistor 505 through a resistor 525. The resistors 524 and 525 can form a third feedback network. The signal from the output stage 520 is fed back to the gate of the first input transistor 505 through a resistor 526. The output signal from the second output stage 523 is fed back to the gate of the second input transistor 506 through a resistor 527. The sources of the transistors 505, 506 are connected through resistor 507. The resistors 524 and 525 can form a fourth feedback network.

Figure 7:
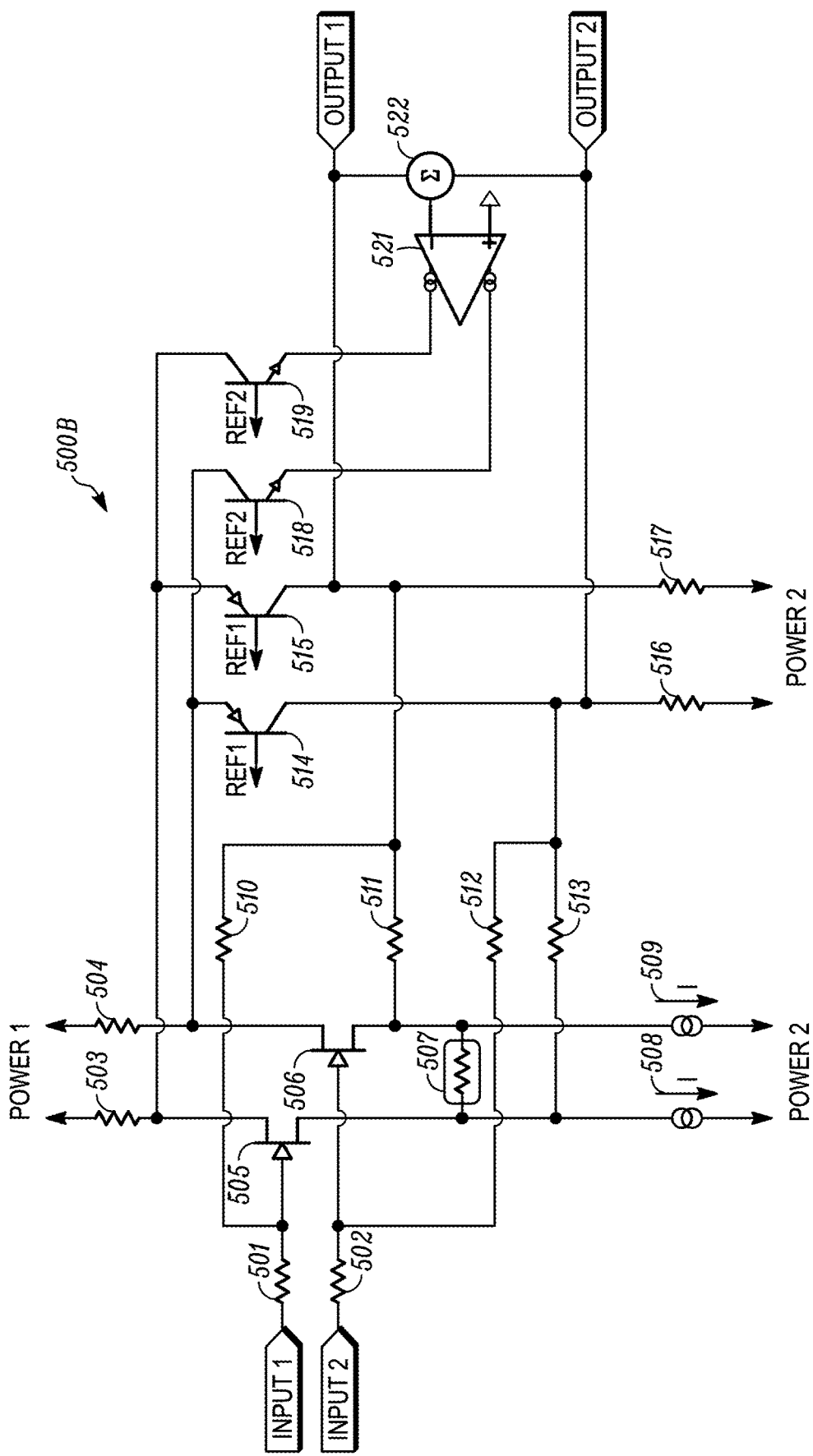
FIG. 7 illustrates a plural feedback loops instrumentation folded cascode amplifier, according to an embodiment.

FIG. 7 illustrates an example embodiment of an instrumentation amplifier circuit 500B with a plurality of feedback loops. Like elements to the preceding embodiments use the same reference numbers. The instrumentation amplifier circuit 500B is similar to the instrumentation amplifier circuit 500 and includes a current follower circuit and a dependent current source providing additional feedback to the differential input stage. More specifically, additional feedback loops are provided through summing network 522, a dependent current source 521 and two current followers 518, 519. In an example, the current followers 518, 519 are common base bipolar devices. The bases of transistors 518, 519 are connected to the voltage reference. The voltage reference may be different from the power levels 1 and 2 and may be different that the voltage reference to the amplifying stage device 514, 515. The collector of the fifth transistor 518 is connected to the emitter of third transistor 514. The collector of the sixth transistor 519 is connected to the emitter of fourth transistor 515. Emitters of transistors 518, 519 are fed from the paraphrase outputs of dependent current source 521. The current followers 518, 519 and dependent current source 521 are designed to compensate for asymmetry in output signal at OUTPUT 1 and OUTPUT2. The summing circuit 522 sums the OUTPUT 1 and OUTPUT2 and sends a sum signal to control the dependent current source 521.

Figure 8:
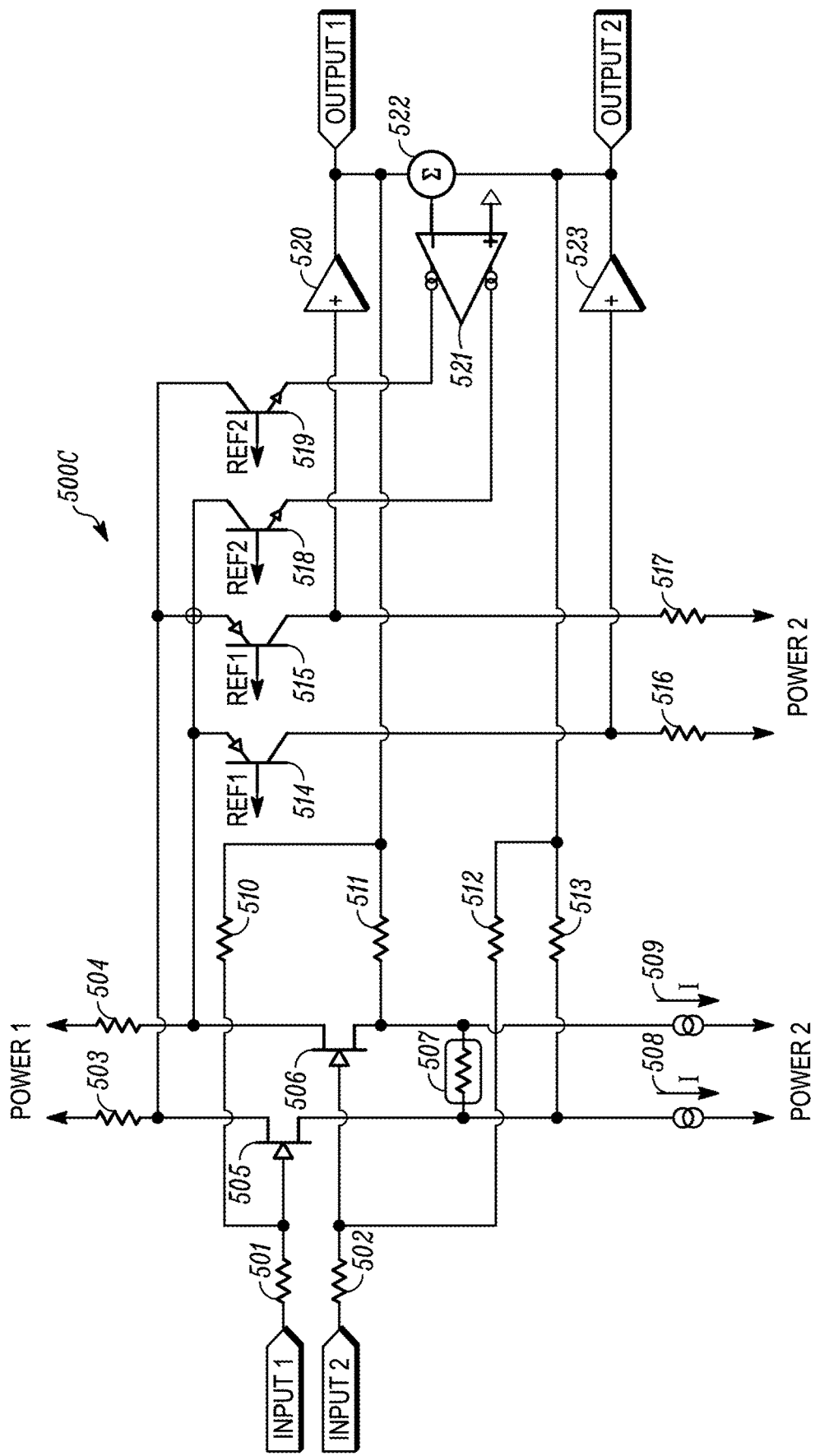
FIG. 8 illustrates a plural feedback loops instrumentation folded cascode amplifier, according to an embodiment.

FIG. 8 illustrates an example embodiment of an instrumentation amplifier circuit 500C with a plurality of feedback loops. Like elements to the preceding embodiments use the same reference numbers. The instrumentation amplifier circuit 500C is similar to the instrumentation amplifier circuits 500B and 500C, including the current follower circuit, the dependent current source and the output buffer circuit. The output signal from the folded cascode amplifying stage is fed only to the output buffer stage. More specifically, the collectors of the transistors 514, 518 of the amplifying stage fed to the single input of the buffers 520, 523, respectively. The output from the buffers 520, 523 are the outputs (OUTPUT 1 and OUTPUT 2) of the instrumentation amplifier circuit 500C. The output from the first buffer 520 is fed back to the source of second input transistor 506 through resistor 511. The output from the first buffer 520 is fed back to the gate of first input transistor 505 through resistor 510. The output from second buffer 523 is fed back to the source of the first input transistor 505 through resistor 513. The output from the second buffer 523 is fed back to the gate of the second input transistor 506 through the resistor 512. The collector of the fifth transistor 518 of the current follower circuit is connected to the emitter of third transistor 514. The collector of the sixth transistor 519 of the current follower circuit is connected to the emitter of fourth transistor 515. Emitters of transistors 518, 519 are fed from the paraphrase outputs of dependent current source 521. The current follower transistors 518, 519 and dependent current source 521 are designed to compensate for asymmetry in output signal at OUTPUT 1 and OUTPUT2. The summing circuit 522 sums the OUTPUT 1 and OUTPUT2 from output buffers 520, 523 and provides a sum signal to control the dependent current source 521.

Figure 9:
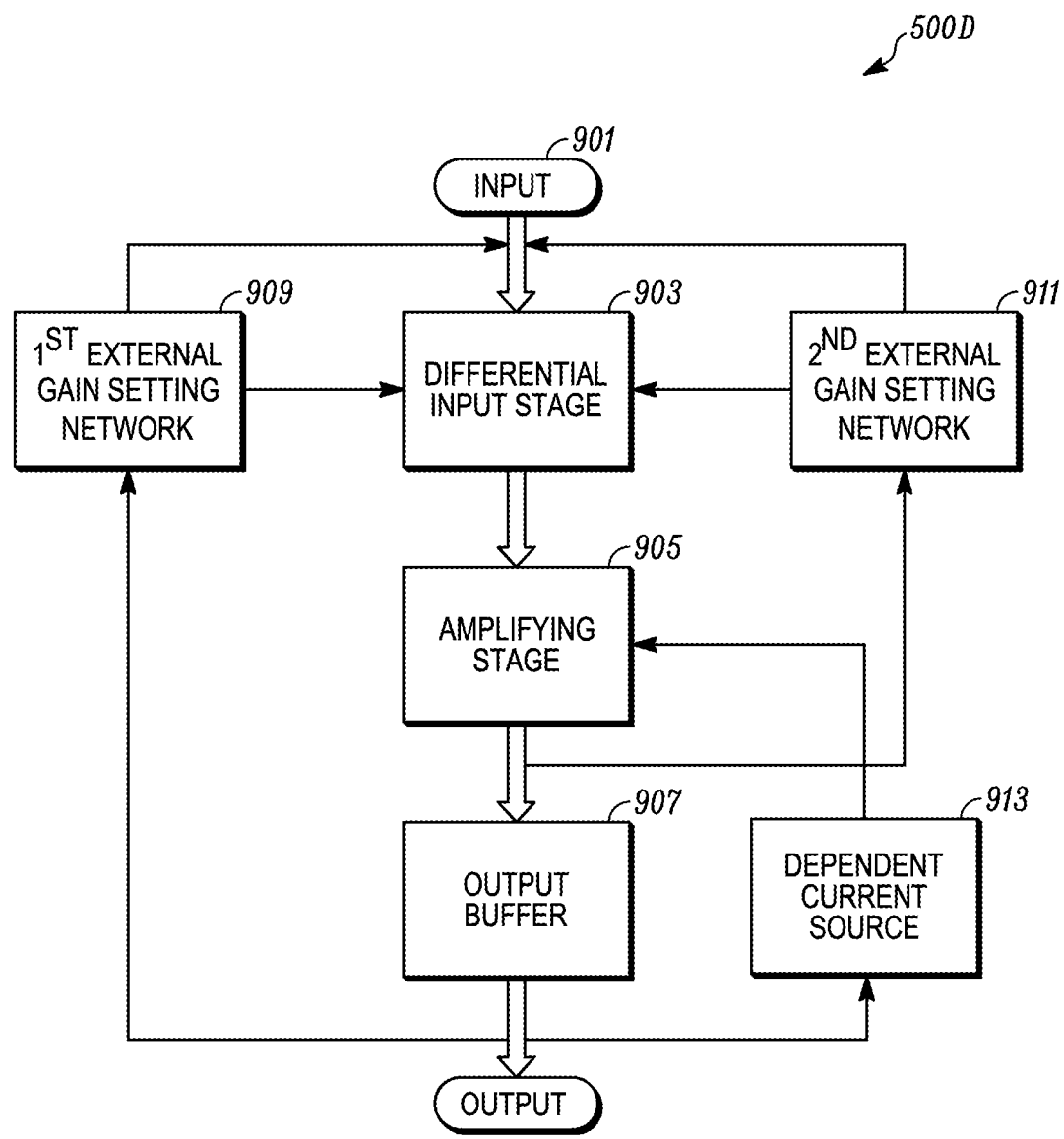
FIG. 9 illustrates a plural feedback loops instrumentation folded cascode amplifier, according to an embodiment.

FIG. 9 shows a schematic view of an instrumentation amplifier circuit 500D. A differential input signal is provided by the input 901. The differential input signal can be an audio signal. The audio signal can be an analog signal that represents sounds in the range of human hearing or just beyond the ranges of human hearing. A differential input stage 903 receives the input signal from the input 901. The differential input stage 903 outputs a signal to the amplifying stage 905. The amplifying stage 905 amplifies the signal and outputs the amplified signal to the output buffer 907. The output buffer 907 outputs a signal from the instrumentation amplifier circuit 500D and may provide protection to the circuit 500D from the load at the outputs. At least a first external gain setting stage 909 and a second gain setting stage 911 are electrically connected between the output buffer 907 and the differential input stage 903. The first external gain setting stage 909 and the second gain setting stage 911 provide discrete feedback networks from the output to the input stage 903. A dependent current source 913 may be provided to additional control the distortion of the amplified signal. The circuit 500D may operate to provide an enhanced common mode rejection ratio of a single gain block in the instrumentation amplifier. In some examples, the circuit 500D may have a differential folded cascode amplifying stage which permits high precision and low distortion of amplified signals without degrading the common mode rejection ratio at the input stage.

In operation, the first transistor 505 and the second transistor 506 of the differential input stage have a cascode (common-base) configuration and their drain terminals connected to emitter of the amplifying (level-shifting) transistors 514, 515, respectively. Using a folded cascode input stage is believed to address the input capacitance issue of some prior circuit designs. The presently described instrumentation amplifier circuits 500, 500A, 500B, 500C obtain a negative feedback by connecting the output from the amplifier (output stage) back to the sources of the first and second transistors of the input differential stage through resistor networks. In an example, a first network (e.g., the resistor 507 and the resistors 513 and 511) provides a feedback signal to the differential input stage. In an example, a second network directs the output from the amplifier (output stage) back to the gates of the first and second transistors of the differential input stage (e.g., through the resistor 510 and the resistor 512). Additional feedback loops are provided through the summing network 522, the dependent current source 521 and the two current followers 518, 519.

The present circuitry described herein may have a plural feedback loops in instrumentation amplifier with differential folded cascode input stage. The present circuitry may operate to provide an enhanced common mode rejection ratio of a single gain block instrumentation amplifier. The present circuitry may have a differential folded cascode amplifying stage which permits high precision and low distortion of amplified signals without degrading common mode rejection ratio. The above and other advantages of the present disclosure are carried out in one form by a differential folded cascode amplifier circuit which may include additional dependent current source and current followers.

The present disclosure describes feedback networks formed from resistors, it will be within the scope of the present disclosure to use a plurality of resistive elements in place of a single illustrated resistor.

The present disclosure uses the term stage to represent various processing stages in circuitry. The stages may include a plurality of discrete electrical components to provide the signal processing of a described stage.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An instrumentation amplifier configured for providing high common mode rejection and low distortion, said instrumentation amplifier comprising:

an input differential stage configured to receive a differential input voltage at a first and a second input and to output current mode signals, the input differential stage including a first input transistor and a second input transistor;

a folded cascode amplifying stage configured to receive output current mode signals from the input differential stage;

a plurality of feedback networks operating as gain setting circuitry, wherein a first resistor feedback network of the plurality of feedback networks providing feedback to the first input transistor and the second input transistor, wherein a second resistor feedback network of the plurality of feedback networks providing feedback to inputs of the first input transistor and the second input transistor;
a first resistor connected between a first feedback input and a second feedback input of the first input transistor and the second input transistor;
a second resistor connected between a first output terminal of the folded cascode stage and a second feedback input of the input differential stage; and
a third resistor connected between a second output terminal of the folded cascode amplifying stage and a first feedback input of the input differential stage.

2. The instrumentation amplifier according to claim 1, wherein the second resistor feedback network includes:
a fourth resistor being connected between a first signal input and a gate terminal of the first input transistor of the input differential stage;
a fifth resistor being connected between a first output terminal of the folded cascode amplifying stage and a gate terminal of the first input transistor of the input differential stage;
a sixth resistor being connected between a second input and a gate terminal of the second input transistor of the input differential stage; and
a seventh resistor being connected between a second output terminal of the folded cascode stage and the gate terminal of the second input transistor of the input differential stage.

3. The instrumentation amplifier according to claim 1, further comprising an output buffer configured to receive a differential output signal from the folded cascode amplifying stage and provide an output voltage to the first resistor feedback network and the second resistor feedback network.

4. The instrumentation amplifier according to claim 3, further comprising:
a current buffer stage including a pair of transistors, each of the pair of transistors being configured as a current source to a corresponding transistor of the folded cascode amplifying stage, the current buffer stage being configured to provide a portion of a sum of output signals from the amplifier to input terminals of a folded cascode amplifying stage; and
a dependent current source connected to the current buffer stage, the dependent current source being configured to provide cancellation current to input terminals of folded cascode amplifying stage.

5. The instrumentation amplifier according to claim 1, further comprising:
a first output buffer and a second output buffer, the first and second output buffers being configured to receive a differential signal from the folded cascode amplifying stage; and
wherein the plurality of feedback networks includes a third resistor feedback network.

6. The instrumentation amplifier according to claim 5, wherein the third resistor feedback network includes:
a fourth resistor connected between an output terminal of the first output buffer and a second input of the input differential stage; and
a fifth resistor connected between an output terminal of the second output buffer and the first input of the input differential stage.

7. The instrumentation amplifier according to claim 6, wherein the plurality of feedback networks includes a fourth resistor feedback network including:

a sixth resistor connected between the output terminal of the first output buffer and a gate terminal of the first input transistor of the input differential stage; and
a seventh resistor connected between the output terminal of the second output buffer and a gate terminal of the second input transistor of the input differential stage.

8. The instrumentation amplifier according to claim 7, further comprising:
a current buffer stage including a pair of transistors, each of the pair of transistors being configured as a current source to a corresponding transistor of the folded cascode amplifying stage, the current buffer stage being configured to provide a portion of the sum of the output signals to input terminals of a folded cascode stage; and
a dependent current source connected to the current buffer stage, the dependent current source being configured to provide cancellation current to input terminals of folded cascode stage.

9. An instrumentation amplifier, comprising:
an input differential stage configured to receive a differential input voltage and to output current mode signals;
a folded cascode amplifying stage configured to receive output current mode signals from the input differential stage; and
a plurality of feedback networks operating as gain setting circuitry, wherein a first resistor feedback network of the plurality of feedback networks providing feedback to a first input transistor and a second resistor feedback network of the plurality of feedback networks, wherein the input differential stage receives the differential input at a first and second input, and the input differential stage includes a first input transistor and a second input transistor, wherein the first resistor feedback network includes:
a first resistor connected between a first feedback input and a second feedback input of the first input transistor and the second input transistor;
a second resistor connected between a first output terminal of the folded cascode stage and a second feedback input of the input differential stage; and
a third resistor connected between a second output terminal of the folded cascode amplifying stage and a first feedback input of the input differential stage.

10. The instrumentation amplifier according to claim 9, wherein the second resistor feedback network includes:
a first resistor being connected between a first signal input and a gate terminal of the first input transistor of the input differential stage;
a second resistor being connected between a first output terminal of the folded cascode amplifying stage and a gate terminal of the first input transistor of the input differential stage;
a third resistor being connected between a second input and a gate terminal of the second input transistor of the input differential stage; and
a fourth resistor being connected between a second output terminal of the folded cascode stage and the gate terminal of the second input transistor of the input differential stage.

11. The instrumentation amplifier according to claim 9, further comprising an output buffer configured to receive a differential output signal from the folded cascode amplifying stage and provide an output voltage to the first resistor feedback network and the second resistor feedback network.

12. The instrumentation amplifier according to claim 11, further comprising:

a current buffer stage including a pair of transistors, each of the pair of transistors being configured as a current source to a corresponding transistor of the folded cascode amplifying stage, the current buffer stage being configured to provide a portion of a sum of output signals from the amplifier to input terminals of a folded cascode amplifying stage; and a dependent current source connected to the current buffer stage, the dependent current source being configured to provide cancellation current to input terminals of folded cascode amplifying stage.

13. The instrumentation amplifier according to claim 9, further comprising:

a first output buffer and a second output buffer, the first and second output buffers being configured to receive a differential signal from the folded cascode amplifying stage; and wherein the plurality of feedback networks includes a third resistor feedback network.

14. The instrumentation amplifier according to claim 13, wherein the third resistor feedback network includes:

a first resistor connected between an output terminal of the first output buffer and a second input of the input differential stage; and a second resistor connected between an output terminal of the second output buffer and the first input of the input differential stage.

15. The instrumentation amplifier according to claim 14, wherein the plurality of feedback networks includes a fourth resistor feedback network including:

a third resistor connected between the output terminal of the first output buffer and a gate terminal of the first input transistor of the input differential stage; and a fourth resistor connected between the output terminal of the second output buffer and a gate terminal of the second input transistor of the input differential stage.

16. The instrumentation amplifier according to claim 15, further comprising:

a current buffer stage including a pair of transistors, each of the pair of transistors being configured as a current source to a corresponding transistor of the folded cascode amplifying stage, the current buffer stage being configured to provide a portion of the sum of the output signals to input terminals of a folded cascode stage; and a dependent current source connected to the current buffer stage, the dependent current source being configured to provide cancellation current to input terminals of folded cascode stage.

17. An instrumentation amplifier configured for providing high common mode rejection and low distortion, said instrumentation amplifier comprising:

an input differential stage configured to receive a differential input voltage at a first and a second input and to output current mode signals, the input differential stage including a first input transistor and a second input transistor;

a folded cascode amplifying stage configured to receive output current mode signals from the input differential stage;

a plurality of feedback networks operating as gain setting circuitry, wherein a first resistor feedback network of the plurality of feedback networks providing feedback to the first input transistor and the second input transistor, wherein a second resistor feedback network of the plurality of feedback networks providing feedback to inputs of the first input transistor and the second input transistor, wherein the second resistor feedback network includes:

a first resistor being connected between a first signal input and a gate terminal of the first input transistor of the input differential stage;

a second resistor being connected between a first output terminal of the folded cascode amplifying stage and a gate terminal of the first input transistor of the input differential stage;

a third resistor being connected between a second input and a gate terminal of the second input transistor of the input differential stage; and a fourth resistor being connected between a second output terminal of the folded cascode stage and the gate terminal of the second input transistor of the input differential stage.

* * * * *